(12) United States Patent
Scharner et al.

(10) Patent No.: US 10,217,941 B2
(45) Date of Patent: Feb. 26, 2019

(54) METHOD FOR PRODUCING AN ORGANIC LIGHT-EMITTING DIODE AND ORGANIC LIGHT-EMITTING DIODE

(71) Applicant: OSRAM OLED GmbH, Regensburg (DE)

(72) Inventors: Silke Scharner, Regensburg (DE); Thomas Wehlus, Lappersdorf (DE); Nina Riegel, Tegernheim (DE); Arne Fleißner, Regensburg (DE); Johannes Rosenberger, Regensburg (DE); Daniel Riedel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/549,994

(22) PCT Filed: Feb. 5, 2016

(86) PCT No.: PCT/EP2016/052518
§ 371 (c)(1),
(2) Date: Aug. 9, 2017

(87) PCT Pub. No.: WO2016/128324
PCT Pub. Date: Aug. 18, 2016

(65) Prior Publication Data
US 2018/0013066 A1 Jan. 11, 2018

(30) Foreign Application Priority Data

Feb. 9, 2015 (DE) .................. 10 2015 101 820
Feb. 26, 2015 (DE) .................. 10 2015 102 784

(51) Int. Cl.
*H01L 51/00* (2006.01)
*H01L 51/52* (2006.01)
*H01L 51/56* (2006.01)

(52) U.S. Cl.
CPC ...... *H01L 51/0023* (2013.01); *H01L 51/5206* (2013.01); *H01L 51/5268* (2013.01); *H01L 51/56* (2013.01)

(58) Field of Classification Search
CPC ............. H01L 51/0023; H01L 51/5206; H01L 51/5268; H01L 51/56
See application file for complete search history.

(56) References Cited

U.S. PATENT DOCUMENTS

2008/0143906 A1 6/2008 Allemand et al.
2011/0180906 A1* 7/2011 Wessels ................ B82Y 10/00
257/618

(Continued)

FOREIGN PATENT DOCUMENTS

WO 2013056155 A2 4/2013
WO 2014161380 A1 10/2014

OTHER PUBLICATIONS

"Cambrios Partners with Novaled to Produce 100 sqcm OLED Lighting Tile with New Highly Transparent Electrodes," Partnership Enables Innovative OLED Tile Design and Shapes the Future of OLED Lighting Technology, www.pressebox.de, downloaded Oct. 13, 2014, 3 pages.

(Continued)

*Primary Examiner* — Fei Fei Yeung Lopez
(74) *Attorney, Agent, or Firm* — Slater Matsil, LLP

(57) ABSTRACT

A method for producing an organic light-emitting diode and an organic light-emitting diode are disclosed. In an embodiment, the method includes providing a substrate with a continuous application surface, generating multiple adhesion regions on the application surface, the adhesion regions being completely surrounded by the application surface, applying metal nanowires over the entire surface of the application surface, removing the metal nanowires outside of the adhesion regions by a washing process using a solvent (Continued)

such that the remaining metal nanowires completely or partly form a light-permeable electrode of the organic light-emitting diode, and applying an organic layer sequence onto the light-permeable electrode.

14 Claims, 4 Drawing Sheets

(56) References Cited

U.S. PATENT DOCUMENTS

| | | |
|---|---|---|
| 2013/0040123 A1 | 2/2013 | Cho et al. |
| 2013/0105770 A1 | 5/2013 | Pschenitzka |
| 2014/0284083 A1 | 9/2014 | Srinivas et al. |
| 2014/0338735 A1 | 11/2014 | Allemand et al. |

OTHER PUBLICATIONS

Hecht, D.S. et al., "Emerging Transparent Electrodes Based on Thin Films of Carbon Nanotubes, Graphene, and Metallic Nanostructures," Advanced Materials, vol. 23, 2011, 32 pages.

* cited by examiner

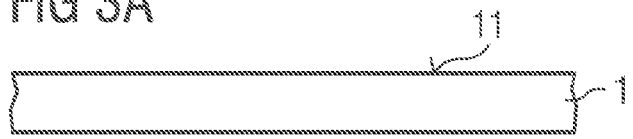
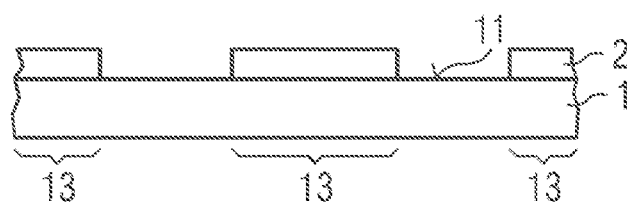
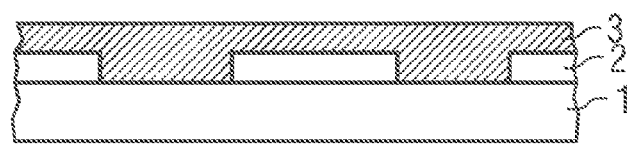
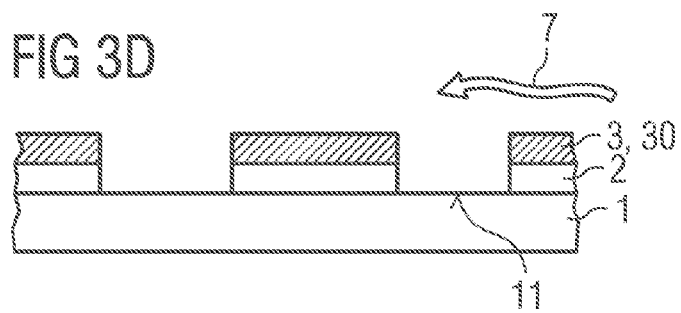
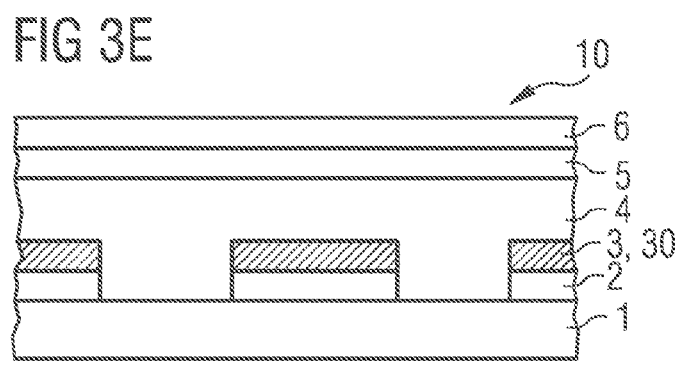

METHOD FOR PRODUCING AN ORGANIC LIGHT-EMITTING DIODE AND ORGANIC LIGHT-EMITTING DIODE

This patent application is a national phase filing under section 371 of PCT/EP2016/052518, filed Feb. 5, 2016, which claims the priority of German patent application 10 2015 101 820.9, filed Feb. 9, 2015 and German patent application 10 2015 102 784.4, filed Feb. 26, 2015, each of which is incorporated herein by reference in its entirety.

TECHNICAL FIELD

A method for producing an organic light-emitting diode is provided. In addition, a corresponding organic light-emitting diode produced by such a method is provided.

SUMMARY OF THE INVENTION

Embodiments of the invention provide a method for efficiently patterning an electrode of an organic light-emitting diode.

According to at least one embodiment, an organic light-emitting diode is produced by the method. The organic light-emitting diode is preferably configured to emit visible light, e.g., colored light or white light. The generation of radiation here takes place in at least one organic layer sequence having one or more active zones. The organic layer sequence here comprises one or more partial layers, each of which is based on at least one organic material.

According to at least one embodiment, the method comprises the step of providing a substrate. The substrate contains an application surface. The application surface is preferably a continuous, unpatterned surface. The application surface can be a planar main side of the substrate.

According to at least one embodiment, the method comprises the step of generating one or more adhesion regions. The adhesion regions here are preferably completely surrounded by the application surface. In other words, the adhesion regions then represent multiple parts of the application surface. Seen in a top view, the adhesion regions are located completely within the application surface. It is possible that the various adhesion regions are separated from one another, so that the adhesion regions are not connected with one another.

According to at least one embodiment, metal nanowires are applied onto the application surface. Preferably, the metal nanowires are applied over the entire surface of the application surface. In other words, the entire application surface is then covered by the metal nanowires after step C, so that the metal nanowires then extend both over the adhesion regions and over the remaining regions of the application surface. It is possible that the metal nanowires are applied over the entire application surface in a uniform thickness and/or concentration.

According to at least one embodiment, the metal nanowires are removed outside of the adhesion regions. The removal comprises or consists of the step of washing off the metal nanowires. The washing takes place using one or multiple solvents. After the step of removing the metal nanowires, the areas of the application surface other than the adhesion regions are preferably completely or substantially free from the metal nanowires.

According to at least one embodiment, the metal nanowires remaining in the adhesion regions completely or partially form an electrode, e.g., an anode, of the organic light-emitting diode. This electrode is preferably a translucent electrode. Translucent can mean that this electrode has an average transmittance of at least 70% or 80% or 90% for the radiation generated by the organic light-emitting diode during operation. The translucent electrode can also comprise a further material in addition to the metal nanowires, in particular an organic, electrically conductive matrix material. The metal nanowires can be embedded in such a matrix material.

According to at least one embodiment, the method comprises the step of applying an organic layer sequence. The organic layer sequence is applied on to the translucent electrode directly or indirectly. Alternatively it is possible that, in turn, the translucent electrode is applied onto the organic layer sequence.

In at least one embodiment, the method is configured for producing one or more organic light-emitting diodes and comprises at least the following steps, preferably in the specified order: A) providing a substrate having a continuous application surface, B) generating multiple adhesion regions on the application surface, wherein the adhesion regions are completely surrounded by the application surface, C) applying metal nanowires over the entire surface of the application surface, D) removing the metal nanowires outside of the adhesion regions by means of washing with a solvent, so that the remaining metal nanowires completely or partially form a translucent electrode of the organic light-emitting diode, and E) applying an organic layer sequence onto the translucent electrode.

According to at least one embodiment of the method, method steps A to E are carried out in the specified order, wherein step D is carried out exclusively using a single solvent, wherein the metal nanowires consist of at least 95 wt. % Ag and have an average diameter of no more than 100 nm and an average length of at least 5 µm, and wherein the metal nanowires are percolated, wherein the adhesion regions are generated in step B by a targeted cleaning of the application surface in some places, wherein the cleaning takes place by irradiation with ultraviolet radiation (R) in combination with an ozone treatment or by irradiation with an oxygen plasma, wherein the adhesion regions are generated in step B by a targeted application of an adhesive coating in some places, such that the adhesive coating is present only in the adhesion regions.

Conventional translucent electrodes for organic light-emitting diodes are often formed by continuous layers based on transparent conductive oxides such as ITO. However, such oxides exhibit limited electrical conductivity and transmittance. In particular, a high electrical conductivity of these oxides is associated with a low transparency and vice versa. By means of the electrode used here, which comprises metal nanowires as a current distributing component, it is possible to achieve an electrode that is optimized in terms of both transparency and electrical conductivity. In addition, metal nanowires can be applied by wet processes from a liquid phase.

The application of the metal nanowires takes place here over the entire surface or in a partially patterned manner and a patterning of an electrode with the metal nanowires to give the desired, final form then takes place conventionally, e.g., by means of laser radiation. This type of back patterning, e.g., by means of laser radiation, is time-consuming, however, and is associated with an increase in investment costs. In addition, with laser treatment in particular, there is the risk of the formation of particles and/or residues, which may have a negative effect on the subsequent encapsulation of the organic light-emitting diode. An efficient, simplified, costsaving and residue-free method of patterning these metal nanowire layers is provided by the method described herein.

According to at least one embodiment, the removal of the nanowires outside of the adhesion regions takes place exclusively using at least one solvent and in particular using precisely one solvent. The solvent is preferably deionized water, also referred to as DI water.

According to at least one embodiment, the metal nanowires have an average diameter of at least 5 nm or 20 nm and/or of no more than 500 nm or 250 nm or 100 nm or 50 nm. Alternatively or in addition, an average length of the metal nanowires is at least 1 µm or 5 µm or 10 µm and/or no more than 1 mm or 250 µm.

According to at least one embodiment, the metal nanowires are silver nanowires. This can mean that the metal nanowires consist of at least 95 wt. % or 99.5 wt. % silver. The metal nanowires can be hollow cylindrical bodies or solid wires, similar to filled-in cylinders.

According to at least one embodiment, the metal nanowires are percolated in the adhesion regions. That is, the metal nanowires form an interconnected network such that continuous, interconnected current-conducting paths are formed from the metal nanowires. An average mesh size of meshes of the network that can be formed from the metal nanowires is preferably at least 50 nm or 100 nm or 250 nm or 0.5 µm and/or no more than 10 µm or 5 µm or 1 µm or 500 nm or 200 nm. In particular, the average mesh size exceeds the average diameter of the metal nanowires by at least a factor of 2 or a factor of 5 and/or by no more than a factor of 100 or 25.

Metal nanowires of this kind and methods for producing corresponding nanowires can be taken, e.g., from the documents US 2008/0143906 A1 and US 2013/0105770 A1. The disclosure content of these documents relating to the metal nanowires is incorporated herein by reference.

According to at least one embodiment, the adhesion regions are generated by a targeted cleaning of the application surface in some places. The cleaning of the adhesion regions preferably takes place in a different way from the cleaning of remaining regions of the application surface. However, the cleaning is not a patterning of the application surface in the sense of significant erosion taking place of a material of the substrate.

According to at least one embodiment, the cleaning includes irradiation with ultraviolet radiation, UV radiation for short. Alternatively or in addition, the cleaning includes the use of an ozone plasma and/or an ozone treatment. Preferably, the irradiation with UV radiation and the ozone treatment are combined with one another. The ozone involved can be generated by the UV radiation.

As a result of the cleaning in particular, a surface activation of the application surface is effected, i.e., specifically an increase in surface energy as a result of the UV-ozone treatment in particular and thus better adhesion of materials such as AgNW on the application surface. Besides an UV-ozone treatment, other plasmas such as oxygen plasmas can also be employed.

According to at least one embodiment, the cleaning comprises a treatment with oxygen plasma. The treatment with oxygen plasma can take place as an alternative to the UV-ozone or UV or ozone treatment or in addition thereto.

According to at least one embodiment, before the cleaning a temporary, transient mask layer is applied onto the application surface. In this case, the adhesion regions to be produced are preferably not covered by the mask layer. In other words, the application surface in this case is freely accessible in the subsequent adhesion regions despite the mask layer. The remaining regions of the application surface, which are not intended as adhesion regions, are preferably completely covered by the mask layer. The mask layer here can be impermeable to reactive gases, in particular those containing oxygen, such as ozone, and/or impermeable to ultraviolet radiation. For example, a material of the mask layer is a metal such as aluminum or stainless steel, so that no UV radiation passes through the mask layer. Likewise, multi-layer systems can be employed for the mask layer, e.g., chromium-coated glass or acrylic sheet (PMMA). Plastic masks composed of, e.g., PEEK, PVDF or PTFE can also be used.

According to at least one embodiment, the mask layer is removed, preferably completely removed, before applying the metal nanowires. In other words, when the metal nanowires are applied, the mask layer is no longer present. As a result, the metal nanowires can be applied over the entire application surface.

According to at least one embodiment, the irradiation with UV radiation takes place only in some areas and not over the entire surface. In particular, no mask layer is necessary in this case, i.e., preferably during the irradiation with ultraviolet radiation or during the entire step of generating the adhesion regions, the application surface, and in particular the entire application surface, is freely accessible and not directly covered by a material in the solid state of aggregation.

According to at least one embodiment, the adhesion regions are generated by applying an adhesive coating. The adhesive coating in this case can be applied over the entire surface of the application surface and patterned only afterwards. Preferably, however, the adhesive coating is applied to the application surface in a targeted and patterned manner only in some areas, e.g., by means of a printing method. The metal nanowires exhibit increased adhesion to the adhesive coating compared with the areas of the application surface not provided with the adhesive coating.

According to at least one embodiment, the adhesive coating is a scattering layer. The scattering layer is configured to scatter the light generated in the organic layer sequence. This allows light outcoupling efficiency from the organic light-emitting diode to be increased.

According to at least one embodiment, the adhesive coating contains a matrix material. The matrix material can be an inorganic or, preferably, an organic material. If the adhesive coating is in the form of a scattering layer, scattering particles are preferably embedded in the matrix material. For example, the scattering particles are formed from a high refractive index material such as titanium dioxide or zirconium dioxide. Alternatively, the scattering particles can also be produced from a comparatively low refractive index material such as silicon dioxide.

According to at least one embodiment, the adhesive coating has a constant and uniform thickness across the adhesion regions. For example, the thickness or the average thickness of the adhesive coating is at least 0.5 µm or 1 µm or 5 µm. Alternatively or in addition, the thickness of the adhesive coating is no more than 100 µm or 50 µm or 15 µm.

According to at least one embodiment, the matrix material of the adhesive coating or scattering layer is one or more of the following materials or the matrix material comprises one or more of the following materials: plastics such as acrylates, epoxides, polyimides or silicone materials; silicon oxide, in particular $SiO_2$; metal oxides such as zinc oxide (ZnO), zirconium oxide ($ZrO_2$), indium tin oxide (ITO), antimony tin oxide (ATO), aluminum zinc oxide (AZO), indium zinc oxide (IZO), titanium oxide, aluminum oxide, in particular $Al_2O_3$; semiconductor oxides such as gallium oxide $Ga_2O_x$.

According to at least one embodiment, the substrate is a glass substrate. Alternatively, the substrate can also be formed from a plastic, which is provided with, e.g., a thin layer of an inorganic, translucent material such as silicon nitride, silicon oxide, aluminum oxide or aluminum nitride. Furthermore, the substrate can be a ceramic substrate. The substrate can be configured to be mechanically rigid or mechanically flexible and thus bendable.

According to at least one embodiment, the metal nanowires are applied by means of slot die coating. In this method a solution containing the metal nanowires or starting substances for the metal nanowires is applied as a homogeneous wet film through a slot-shaped nozzle at a constant distance and constant rate relative to a substrate table. Alternatively to a slot die coating method, other methods such as spin coating or printing methods can be employed to apply the metal nanowires. Methods such as knife coating and spray coating are also possible. Preferably, however, the application takes place by means of slot die coating.

According to at least one embodiment, the organic layer sequence is applied directly onto the metal nanowires. It is possible here that the organic layer sequence or at least one material of the organic layer sequence thus forms a matrix for the metal nanowires. Alternatively, it is possible that a matrix material for the metal nanowires is applied at the same time together with the metal nanowires. Different adhesion of the metal nanowires in the adhesion regions and in the remaining regions of the application surface can then also be achieved by means of this matrix material.

In addition, an organic light-emitting diode is provided. The organic light-emitting diode is produced by a method as provided in connection with one or more of the above-mentioned embodiments. Features of the method are therefore also disclosed for the organic light-emitting diode and vice versa.

According to at least one embodiment, the adhesive layer is applied directly on the substrate. Furthermore, the metal nanowires are preferably applied directly on the adhesive layer. It is possible in this case that the organic layer sequence is not in direct contact with the substrate, at least in the adhesion regions, but is arranged at a distance from the substrate.

According to at least one embodiment, the metal nanowires are located directly on the substrate and therefore touch the substrate at least in some areas.

According to at least one embodiment, the organic layer sequence represents a matrix for the metal nanowires. In this case, it is possible that the organic layer sequence touches the substrate in some areas, in particular in the adhesion regions.

BRIEF DESCRIPTION OF THE DRAWINGS

A method as described here and an organic light-emitting diode as described here are explained in more detail below with the aid of exemplary embodiments with reference to the drawing. The same reference numerals here refer to the same elements in the individual figures. However, references are not to scale; rather, the size of individual elements may be exaggerated to aid understanding.

FIGS. 3A-3E show an embodiment of a production method for an organic light emitting diode.

DETAILED DESCRIPTION OF ILLUSTRATIVE EMBODIMENTS

FIG. 1 shows an example of a production method for an organic light-emitting diode 10. According to FIG. 1A, a substrate 1, e.g., a glass substrate, is provided. The substrate 1 has a flat, planar application surface 11.

Figure 1A:
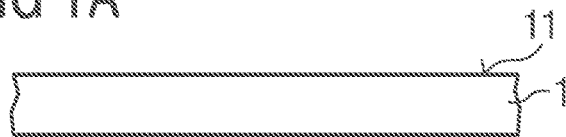
FIGS. 1A-1H show an embodiment of a production method for an organic light-emitting diode.
Figure 1B:
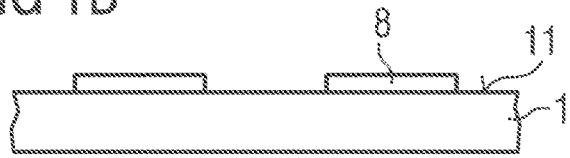

FIG. 1B illustrates the application of a mask layer 8 to the application surface 11 in some areas in patterned form. The mask layer 8 is applied, e.g., by printing and can be formed from a washable ink or a photoresist. The mask layer 8 is preferably a metal mask.

Figure 1C:
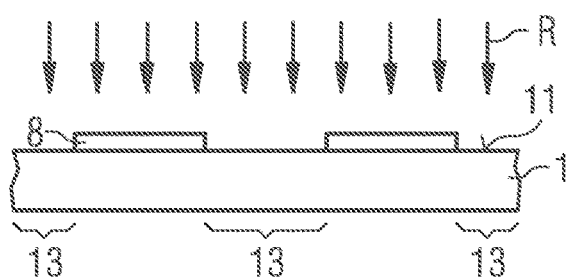

According to FIG. 1C, the substrate 1 is treated with ultraviolet radiation R, e.g., for a period of 10 minutes. The irradiation with the UV radiation R takes place in particular in an oxygen-containing atmosphere, so that ozone is formed as a result of the UV radiation R. The combined UV-ozone treatment results in a surface modification and cleaning of the regions of the application surface 11 not covered by the mask layer 8. These regions of the application surface 11 form multiple adhesion regions 13. The substrate 1 also has a flat, non-roughened surface in the adhesion regions 13.

Figure 1D:
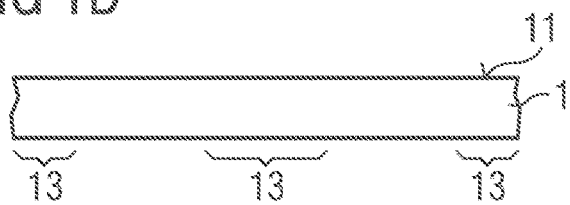

Next, the mask layer 8 is removed, preferably completely removed, see FIG. 1D. The patterning in the adhesion regions 13 cannot readily be seen immediately after removing the mask layer 8.

Figure 1E:
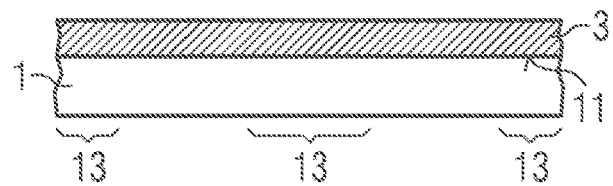

According to FIG. 1E, a layer with metal nanowires 3 is applied to the substrate 1 over the entire surface. The application of the metal nanowires 3 preferably takes place by means of slot die coating, not illustrated. In this case, the metal nanowires 3 are applied directly to the application surface 11 in a solution.

A solvent in which the metal nanowires 3, which are preferably silver nanowires, are dissolved is preferably removed completely in the further production method. It is possible that only the metal nanowires 3 remain on the application surface 11. Alternatively, a binding material or a matrix material for the metal nanowires 3 can also be added to the solution in which the metal nanowires 3 are contained during application. In this case, a layer is obtained on the application surface 11 containing the metal nanowires 3 as well as the binder.

Deviating from the illustration in FIG. 1E, it is also possible that the metal nanowires 3 are applied to the application surface 11 only in some areas, e.g., in rectangular regions. In this case too, however, the metal nanowires 3 are applied to the application surface 11 both in the adhesion regions 13 and outside of the adhesion regions 13.

Figure 1F:
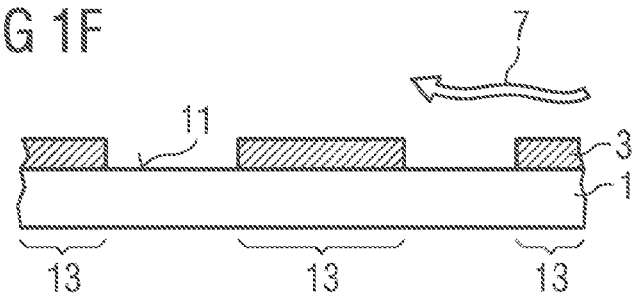

As illustrated in FIG. 1F, the removal of the metal nanowires 3 outside of the adhesion regions 13 takes place using a solvent 7. The solvent 7 is preferably deionized water, DI water for short. For example, the substrate 1 with the initially continuous metal nanowire layer 3 is immersed for several seconds, e.g., for ten seconds, in DI water. As a result, the metal nanowires 3 from the regions outside of the adhesion regions 13 are removed from the substrate 1. If a binder has been applied together with the metal nanowires 3, the binder is preferably a water-soluble polymer, which is accordingly dissolved. If a mask layer 8 is also present in this method step, the mask layer 8 is preferably also dissolved by the solvent 7.

Deviating from the illustration in FIG. 1, it is also possible that the mask layer 8 is still present in the method step of FIG. 1E. In this case, the metal nanowires 3 preferably display poorer adhesion to the mask layer 8 or the mask layer 8 adheres less readily to the application surface 11 than the metal nanowires 3. As a result, see FIG. 1F, it is ensured that the metal nanowires 3 only remain on the substrate 1 in the adhesion regions 13.

Figure 1G:

In FIG. 1G, an optional method step is illustrated. In FIG. 1G, an additional binder 33 is subsequently applied to the metal nanowires 3 to fix these on the substrate 1 further. Deviating from the illustration, it is possible that the additional binder 33 is applied over the entire surface of the application surface 11.

Figure 1H:
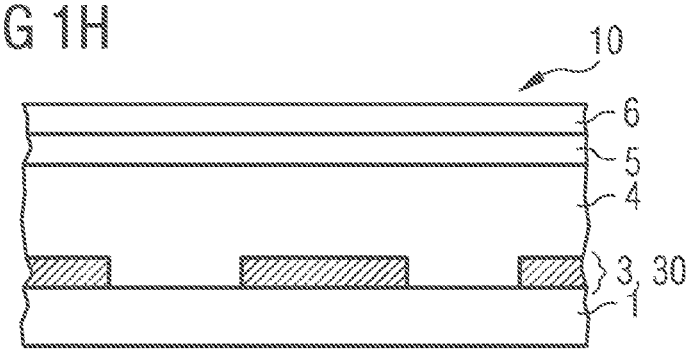

In FIG. 1H, the further method steps are illustrated in simplified form. An organic layer sequence 4 is applied to the metal nanowires 3, which form a transparent electrode 30 of the finished organic light-emitting diode 10. In the organic layer sequence 4, preferably visible light is generated during operation of the light-emitting diode 10. In a direction away from the substrate 1, the organic layer sequence 4 is followed by a second electrode 5, which can be a reflective electrode or a radiation-transmitting electrode. An encapsulating layer 6 is optionally applied to the second electrode 5.

Deviating from the illustration in FIG. 1H, it is also possible that the organic layer sequence 4, the second electrode 5 and/or the encapsulating layer 6 are applied to the substrate 1 and/or the transparent electrode 30 not continuously but in a patterned form. In this case, not all of the application surface 11 is covered by the organic layer sequence 4, the second electrode 5 and/or the encapsulating layer 6. Between the adhesion regions 13, separation regions (not illustrated) can be provided in which singulation of the substrate 1 into smaller units can take place.

Further method steps, such as further encapsulating or dividing into individual light-emitting diode elements, are not illustrated in any of the figures to simplify the illustration. Similarly, further elements of the light-emitting diodes 10 such as external electrical connections or complementary current distribution structures are also not illustrated.

The step illustrated in FIG. 1F can already be a cleaning step, which is necessary for applying the organic layer sequence 4. An appropriate pre-cleaning before applying the organic layer sequence 4, which is applied in particular by means of vapor deposition, can take place by means of a so-called spin rinse dryer or SRD for short.

Figure 2:
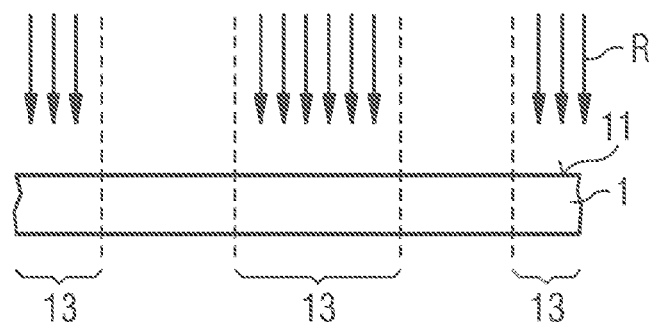
FIG. 2 shows an embodiment of a targeted irradiation of the application surface with the UV radiation only in some areas.

In the method as illustrated in FIG. 2, the step according to FIG. 1C takes place by a targeted irradiation of the application surface 11 with the UV radiation R only in some areas. As a result, there is no need for a mask layer 8 directly on the application surface 11. Those regions of the application surface 11 that are irradiated with the UV radiation R then represent the adhesion regions 13. The remaining method steps can take place as in FIG. 1.

A further exemplary embodiment of a production method is illustrated in FIG. 3. According to FIG. 3A, the substrate 1 with the application surface 11 is provided.

It can be seen in FIG. 3B that the application surface 11 is provided in some areas with an adhesive coating 2. The regions provided with the adhesive coating 2 represent the adhesion regions 13. The adhesive coating 2 is, e.g., a scattering layer for the light generated in the light-emitting diode 10 during operation.

According to FIG. 3C, the metal nanowires 3 are applied over the entire surface, wherein the adhesive coating 2 is overmolded with the metal nanowires 3.

In FIG. 3D, the patterning of the layer with the metal nanowires 3 takes place to form the transparent electrode 30. This patterning takes place as in FIG. 1F, using the solvent 7. The metal nanowires 3 are washed off by means of the solvent 7 in the regions of the application surface 11 not covered by the adhesive coating 2. Next, the organic layer sequence, the second electrode 5 and the optional encapsulating layer 6 are applied, see FIG. 3E.

The method described herein provides a simple option of patterning all-over layers with the metal nanowires 3 over the entire surface. By means of the cleaning step necessary for applying the organic layer sequence 4, a patterned removal of the metal nanowires 3 is made possible at the same time. As a result, the time and costs otherwise needed for subsequent laser patterning, which can be omitted, are saved. This is especially true in the case of an extensive back patterning instead of line isolation. A risk of particle formation and residues from a laser method is also avoided, so that the organic light-emitting diode can be encapsulated more reliably. Furthermore, the method described here results in greater design flexibility in terms of patterning, particularly in relation to the transparent electrode 30.

Figure 4A:
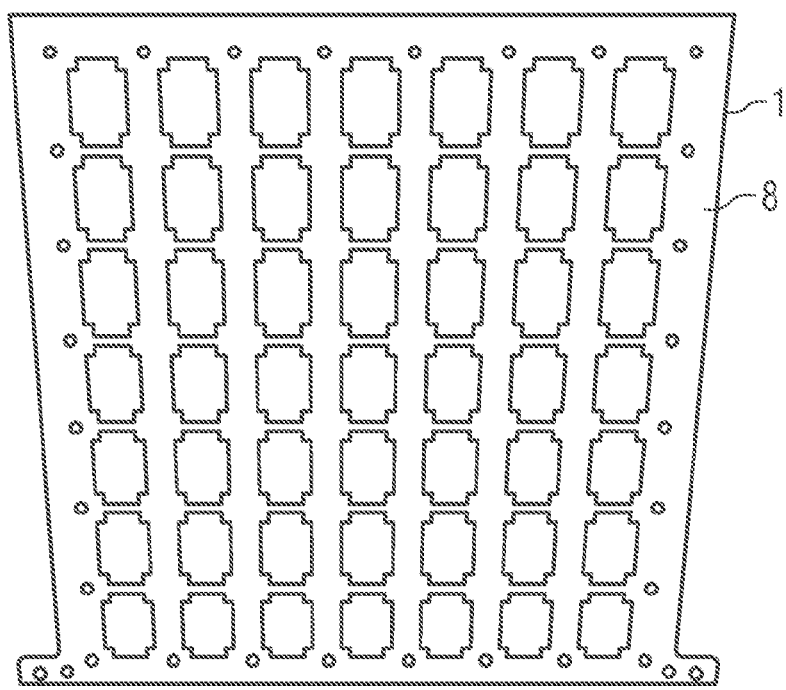
FIG. 4A-4B shows top view diagrams of an exemplary embodiment of a mask layer and a translucent electrode for organic light-emitting diodes as described here.
Figure 4B:
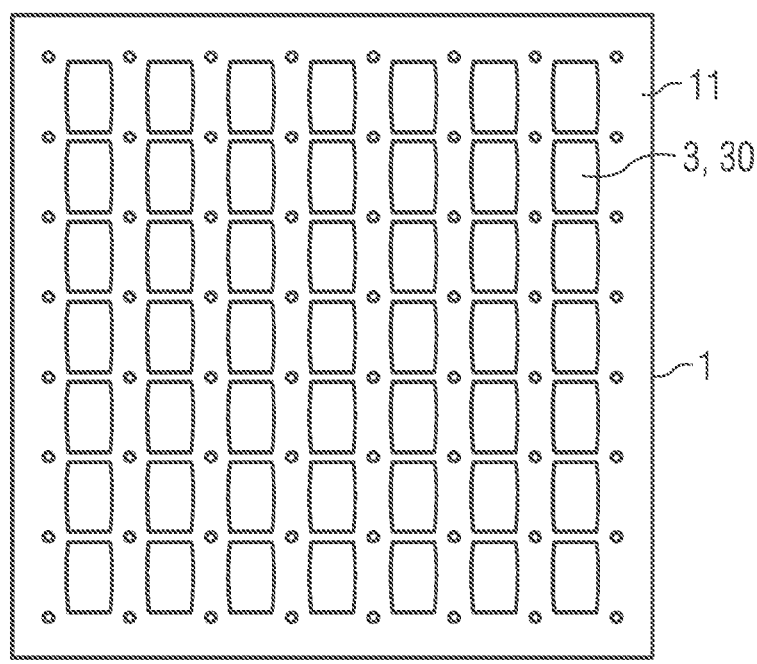

In FIG. 4A, a metallic mask layer 8 is shown in a schematic top view of an application surface 11. In FIG. 4B, the resulting translucent electrode 30 composed of silver nanowires is illustrated. The surface proportion of the silver nanowires 3 in relation to the entire application surface 11, as in all the other exemplary embodiments, is in particular at least 25% or 35% and/or no more than 80% or 60%. The mask layer 8 here is formed as a negative of the finished translucent electrode 30 and is no longer present in the finished light-emitting diode. The individual areas covered by the nanowires 3 are not interconnected and, seen in a top view, are arranged in the form of a matrix and in approximately rectangular configuration. In a marginal region of the matrix arrangement in particular, electrical contact regions and/or orientation markings can be applied.

The description by means of the exemplary embodiments does not limit the invention described here thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method for producing an organic light-emitting diode, the method comprising:
   providing a substrate having a continuous application surface;
   generating a plurality of adhesion regions on the application surface by a targeted application of an adhesive coating in places such that the adhesive coating is present only in the adhesion regions, wherein the adhesion regions are completely surrounded by the application surface and wherein the adhesive coating is a scattering layer that comprises an organic matrix material and scattering particles embedded therein;
   applying metal nanowires over the entire surface of the application surface;
   removing the metal nanowires outside of the adhesion regions by washing with a solvent so that remaining metal nanowires completely or partially form a translucent electrode of the organic light-emitting diode; and applying an organic layer sequence onto the translucent electrode.

2. The method according to claim 1;

wherein the method steps are carried out in the indicated order;

wherein the metal nanowires are removed using a single solvent;

wherein the metal nanowires consist of at least 95 wt. % Ag and have an average diameter of no more than 100 nm and an average length of at least 5 m;

wherein the metal nanowires are percolated;

wherein the adhesion regions are generated by a targeted cleaning of the application surface in places;

wherein the cleaning takes place by irradiation with ultraviolet radiation in combination with an ozone treatment or by irradiation with an oxygen plasma; and wherein the adhesion regions are generated by a targeted application of an adhesive coating in places such that the adhesive coating is present only in the adhesion regions.

3. The method according to claim 1, wherein the method steps are carried out in the specified order;

wherein the metal nanowires are removed out using a single solvent;

wherein the metal nanowires consist of at least 95 wt. % Ag and have an average diameter of no more than 100 nm and an average length of at least 5 μm; and wherein the metal nanowires are percolated.

4. The method according to claim 1, wherein the adhesion regions are generated by a targeted cleaning of the application surface in places.

5. The method according to claim 4, wherein the cleaning takes place by irradiation with ultraviolet radiation in combination with an ozone treatment.

6. The method according to claim 4, further comprising, before the cleaning, applying a temporary mask layer that covers the application surface completely apart from the adhesion regions, wherein the mask layer is removed before applying the metal nanowires.

7. The method according to claim 4, wherein the cleaning comprises irradiation with ultraviolet radiation;

wherein the irradiation takes place only in some areas; and wherein the application surface is freely accessible during the entire time that the adhesion regions are being generated.

8. The method according to claim 1, wherein a thickness of the adhesive coating is between 0.5 μm and 100 μm inclusive.

9. The method according to claim 1, wherein the matrix material comprises a material selected from the group consisting of acrylate, epoxide, polyimide, silicone, $SiO_2$, ZnO, $ZrO_2$, indium tin oxide, antimony tin oxide, aluminum zinc oxide, indium zinc oxide, $TiO_2$, $Al_2O_3$, and gallium oxide $Ga_2O_x$ and combinations thereof.

10. The method according to claim 1;

wherein the solvent is deionized water;

wherein the substrate is a glass substrate; and wherein the metal nanowires are applied by slot die coating.

11. The method according to claim 1, wherein applying the organic layer sequence comprises applying the organic layer sequence so that the organic layer sequence extends directly to the metal nanowires and forms a matrix for the metal nanowires.

12. An organic light-emitting diode, wherein the organic light-emitting diode is produced according to the method of claim 1.

13. The organic light-emitting diode according to claim 12;

wherein an adhesive coating is disposed directly on the substrate;

wherein the metal nanowires are disposed directly on the adhesive coating and the organic layer sequence forms a matrix for the metal nanowires; and wherein the organic layer sequence is arranged at a distance from the substrate.

14. The organic light-emitting diode according to claim 12;

wherein the metal nanowires are disposed directly on the substrate; and wherein the organic layer sequence forms a matrix for the metal nanowires and touches the substrate in places.

* * * * *

UNITED STATES PATENT AND TRADEMARK OFFICE
CERTIFICATE OF CORRECTION

PATENT NO. : 10,217,941 B2
APPLICATION NO. : 15/549994
DATED : February 26, 2019
INVENTOR(S) : Silke Scharner Page 1 of 1

It is certified that error appears in the above-identified patent and that said Letters Patent is hereby corrected as shown below:

In the Claims

In Column 9, Line 12, Claim 2, delete "5 m" and insert --5 µm--.

Signed and Sealed this
Twenty-third Day of April, 2019

Andrei Iancu
*Director of the United States Patent and Trademark Office*